United States Patent [19]

Tada et al.

[11] Patent Number: 5,362,331
[45] Date of Patent: Nov. 8, 1994

[54] PROCESS AND APPARATUS FOR PRODUCING NB3AL SUPER-CONDUCTING WIRE

[75] Inventors: Naohumi Tada; Yoshihide Wadayama; Kiyoshi Inoue, all of Ibaraki; Kunihisa Kamata, Tokyo, all of Japan

[73] Assignees: Hitachi Ltd.; National Research Institute for Metals; Hitachi Cable Ltd., all of Tokyo, Japan

[21] Appl. No.: 945,985
[22] PCT Filed: May 10, 1991
[86] PCT No.: PCT/JP91/00627
§ 371 Date: Jan. 8, 1993
§ 102(e) Date: Jan. 8, 1993
[87] PCT Pub. No.: WO91/18402
PCT Pub. Date: Nov. 28, 1991

[30] Foreign Application Priority Data

May 11, 1990 [JP] Japan ................... 2-122441

[51] Int. Cl.$^5$ ........................... H01B 12/00
[52] U.S. Cl. ........................ 148/98; 29/599; 148/96; 148/901; 428/930
[58] Field of Search ............ 148/96, 98, 901; 428/930; 29/599

[56] References Cited

U.S. PATENT DOCUMENTS

| | | | |
|---|---|---|---|
| 3,458,293 | 7/1969 | Schindler | 428/930 |
| 3,710,844 | 1/1973 | Doi et al. | 29/599 |
| 3,907,550 | 9/1975 | Critchlow | 29/599 |
| 4,003,762 | 1/1977 | Ceresara et al. | 148/98 |
| 4,088,512 | 5/1978 | Pickus et al. | 148/98 |
| 4,537,642 | 8/1985 | Saito et al. | 148/98 |
| 4,729,801 | 3/1988 | Togano et al. | 148/133 |
| 4,752,654 | 6/1988 | Iida et al. | 29/599 |
| 4,917,965 | 4/1990 | Inoue et al. | 428/930 |
| 5,001,020 | 3/1991 | Ohmatsu et al. | 428/651 |
| 5,011,545 | 4/1991 | Ikeda et al. | 148/98 |
| 5,174,831 | 12/1992 | Wong et al. | 148/98 |

FOREIGN PATENT DOCUMENTS

| | | | |
|---|---|---|---|
| 0284557 | 12/1986 | Japan . | |
| 1292709 | 11/1989 | Japan | 148/98 |
| 0319647 | 12/1989 | Japan . | |
| 4132210 | 5/1992 | Japan | 148/98 |

OTHER PUBLICATIONS

Inoue et al Appl. Phys. Letts. 52 (1988) 1724.

Primary Examiner—Upendra Roy
Attorney, Agent, or Firm—Helfgott & Karas

[57] ABSTRACT

An electromagnetically stable Nb3Al multifilamentary superconducting wire having a high current density at a high level of magnetic field such as 20 tesla is provided by cold drawing a composite multicore consisting of a large number of Al or Al alloy core and a Nb matrix into a multifilamentary wire, and then dipping the multifilamentary wire into a molten metal bath to coating the periphery of the wire with the molten metal for providing electromagnetically stabilizing the wire. The molten metal bath is provided within an inert gas sealing chamber.

8 Claims, 5 Drawing Sheets

F I G. 1
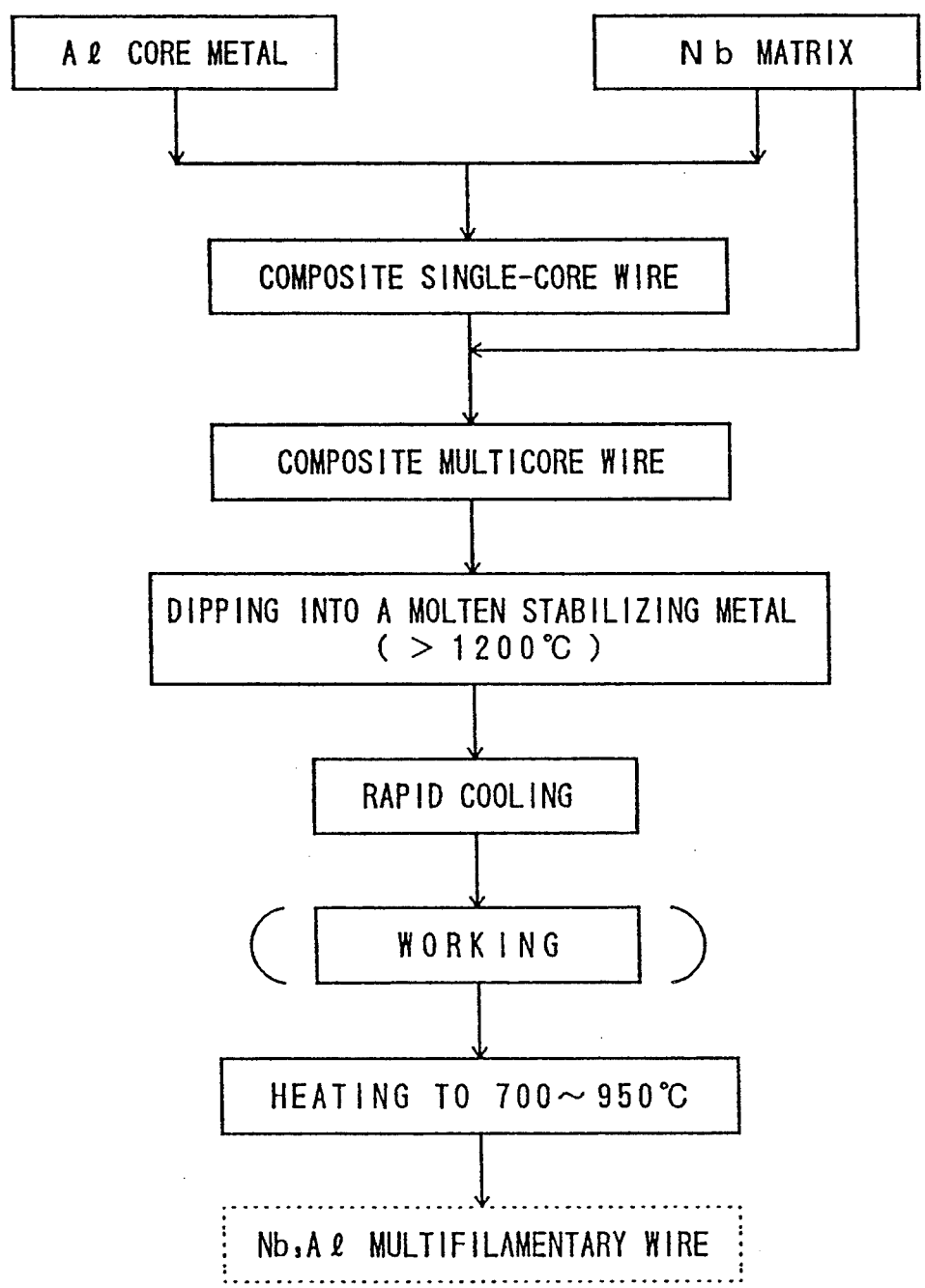

PROCESS AND APPARATUS FOR PRODUCING NB₃AL SUPER-CONDUCTING WIRE

TECHNICAL FIELD

This invention relates to a $Nb_3Al$ superconducting wire, and more particularly, to a process for making an electromagnetically stable $Nb_3Al$ superconducting wire which has a high current density at the high level of magnetic field such as 20 tesla and is coated with a stabilizing material, and an apparatus for making such a $Nb_3Al$ superconducting wire.

BACKGROUND ART

As disclosed in Applied Physics Letter 52(20), May 16, 1988, pp. 1724–1725, one of conventional $Nb_3Al$ superconducting wires has been made by cold drawing a composite consisting of a Nb matrix and a large number of Al-alloy cores into a wire having ultrafine multicores and then heat-treating the cold drawn wire at a temperature ranging from 750° to 950° C. to form a $Nb_3Al$ multifilamentary wire (refer to Composite Forming Process).

Japanese Laid Open Patent Publication No. 29017/87 discloses a $Nb_3Al$ superconducting wire made by mixing Nb and Al powders, forming the mixture into a wire, irradiating an electron beam to the formed wire, and heat treating the irradiated wire at a temperature ranging from 500° to 1000 ° C. to provide a final $Nb_3Al$ superconducting wire (refer to Electron Beam Irradiation Process).

The composite forming process described above has several disadvantages, i.e. a stabilizing metal such as Cu or Al can not be compounded with a matrix; a stoichiometric composition of $Nb_3Al$ cannot be obtained unless an ultrafine filament less than 1 $\mu m$ in diameter is formed; the $Nb_3Al$ multifilamentary wire thus produced has a relatively low critical temperature and a critical magnetic field; and the critical current density falls is steeply at a high level of magnetic field such as 20 tesla.

The electron beam irradiation process described above can not, provide a $Nb_3Al$ superconducting wire having an electromagnetically stable multifilamentary wire structure.

DISCLOSURE OF INVENTION

Accordingly, it is an object of the present invention to provide a process for making an electromagnetically stable $Nb_3Al$ multifilamentary superconducting wire having high current density at a high level of magnetic field such as 20 T, and covered with an electromagnetically stabilizing material, and an apparatus for making such an electromagnetically stable $Nb_3Al$ multifilamentary superconducting wire.

According to the present invention, there is provided a process for making a $Nb_3Al$ multifilamentary superconducting wire comprising the steps of cold-drawing a composite consisting of a large number of Al or Al alloy core materials and a Nb matrix into a composite multi cores wire, and heat treating the cold drawn composite multicore wire, wherein the cold drawn composite multicore wire is dipped into a molten metal to solidify the molten metal around the composite multicore wire for forming an electromagnetically stabilizing metal coating on the periphery of the superconducting wire. Each of the Al or Al alloy core wires of the cold drawn composite multicore wire has a diameter or thickness ranging from about 0.1 to about 10 $\mu m$, and the molten metal consists of Cu, Cu alloy, Ag or Ag alloy.

In the present invention, it is preferred to coat the periphery of the $Nb_3Al$ superconducting wire with an electromagnetically stabilizing metal by dipping a cold drawn composite multicore wire consisting of a large number of Al alloy core wires and a Nb matrix into a molten metal bath such as Cu or Cu alloy, Ag or Ag alloy healed to a temperature higher than 1200° C. for coating the composite wire, rapidly cooling the coated composite wire, and then heat treating the cooled composite wire at a temperature ranging from about 700° to about 950° C.

It is also preferred to increase the critical current density of the $Nb_3Al$ superconducting wire at the high magnetic field by cold drawing the large number of Al alloy core materials into fine wires within the range of inducing no proximity effect, heating the fine wires to a temperature higher than 1200° C., rapid cooling them, and thereafter heat treating them at a temperature ranging from about 700° to about 950° C.

Further, it is preferable to assemble a number of composite multicore wires coated with an electromagnetically stabilizing metal to integrate or strand them for providing an electromagnetically stable $Nb_3Al$ superconducting material for a large current capacity.

In the process of the present invention, a long $Nb_3Al$ superconducting wire with a high accuracy can be economically produced by dipping a long composite multicore wire consisting of a large number of Al alloy core materials and a Nb matrix into a molten metal bath kept at a predetermined temperature under an inert gas atmosphere of 0.1 or more pressure.

The preferred embodiment of the present invention presents an apparatus used in the process for making $Nb_3Al$ superconducting wire described above, wherein a spool for winding off a composite multicore wire, a spool for winding up the wound off composite multicore wire and guide rolls for guiding the composite multicore wire are provided within a sealing chamber having an inert gas supply means and a vacuum exhauster and wherein a molten metal bath and a cooling bath are successively arranged between said guide rolls.

The present invention can intimately coat the periphery of a $Nb_3Al$ superconducting wire with an electromagnetically stabilizing metal by dipping a composite multicore wire consisting of a large number of Al core wires and a Nb matrix into a molten metal such as Cu, Cu alloy, Ag or Al alloy kept at a temperature higher than 1200° C. This process can achieve the heat treatment required for forming a stoichiometric composition of $Nb_3Al$ and the coating of the electromagnetically stabilizing metal simultaneously. Although a part of the matrix Nb may be eluted into the molten Cu kept at 1200° C. or higher temperatures, the elution of Nb from the matrix can be prevented by preforming a solid solution of Nb with Cu. Ag can not form a solid solution with Nb at temperatures ranging from 1400° to 1700° C. and thus the matrix Nb is not eluted into the molten Ag. On the other hand, Cu, Cu alloy, Ag or Ag alloy has a high vapor pressure at high temperatures and thus it is liable to evaporate. This can be inhibited by holding such a molten metal under an inert gas atmosphere of 0.1 or more atmospheric pressure. When the reaction of the molten metal with the Nb matrix is unavoidable, it is an effective method to precoat the surface of the Nb matrix with ceramics or metals other than Nb which have a high melting point and are unreactive to Nb and the molten metal. In any event, an excellent Nb$_3$Al superconducting wire coated with the stabilizing metal can be obtained by coating the composite multicore wire with the stabilizing metal, rapid cooling the coated wire and thereafter heat treating the cooled wire. Even if such a coated stabilizing metal is Cu—Nb alloy, Nb is little occluded in Cu at temperatures of 700° to 950° C. and thus Nb is crystallized out of the Cu—Nb alloy layer and the coating layer results in Cu having a low electric resistivity thereby maintaining the function as an electromagnetically stabilizing material.

When the composite multi core wire has richer Nb than that of stoichiometric composition, a Nb—Al supersaturated solid solution which is rich in Nb and has a body-centered cubic structure can be brought to room temperature by healing the solid solution to temperatures higher than 1200° C. and rapidly cooling it to room temperature. As this Nb—Al supersaturated solid solution has a relatively good workability, it can provide a Nb$_3$Al superconducting wire having the high critical current density by heating the sol id solution to temperatures ranging from 700° to 950° C. after plastic deformation thereof to allow the Nb$_3$Al phase of fine crystals to precipitate from the matrix.

Considering the proximity effect observed in conventional Nb$_3$Al multifilamentary wire, the present invention can provide a Nb$_3$Al multifilamentary wire having a high critical temperature at high critical magnetic field by making the spacing between Al alloy core wires small in the range which the proximity effect does not occur, and combining the high temperature heat treatment, rapid cooling and relatively low heat treatment described above. In a case of the Nb$_3$Al multifilamentary wire, the critical diameter of the core wires which the proximity effect is initiated is 0.1 $\mu$m or less. The object of the present invention can be achieved by making the diameter of the core wires 0.1 $\mu$m or more. It is also required to make the core wire of 10 $\mu$m or less diameter for providing an electromagnetically stable Nb$_3$Al multifilamentary wire.

The present invention can provide an electromagnetically stable Nb$_3$Al superconducting wire for a large current capacity by assembling a number of Al alloy multi core wires/Nb matrix composite wire coated with an electromagnetically stabilizing metal to integrate or strand them. This is the construction of Nb$_3$Al superconducting wire provided for the first time by coating the periphery of the Nb$_3$Al core wires/Nb matrix composite wire with an electromagnetically stabilizing metal.

BRIEF DESCRIPTION OF THE DRAWINGS

FIG. 1 is a block diagram showing steps of making a Nb$_3$Al multifilamentary wire according to the present invention;

BEST MODE FOR CARRYING OUT THE INVENTION

Figure 2:
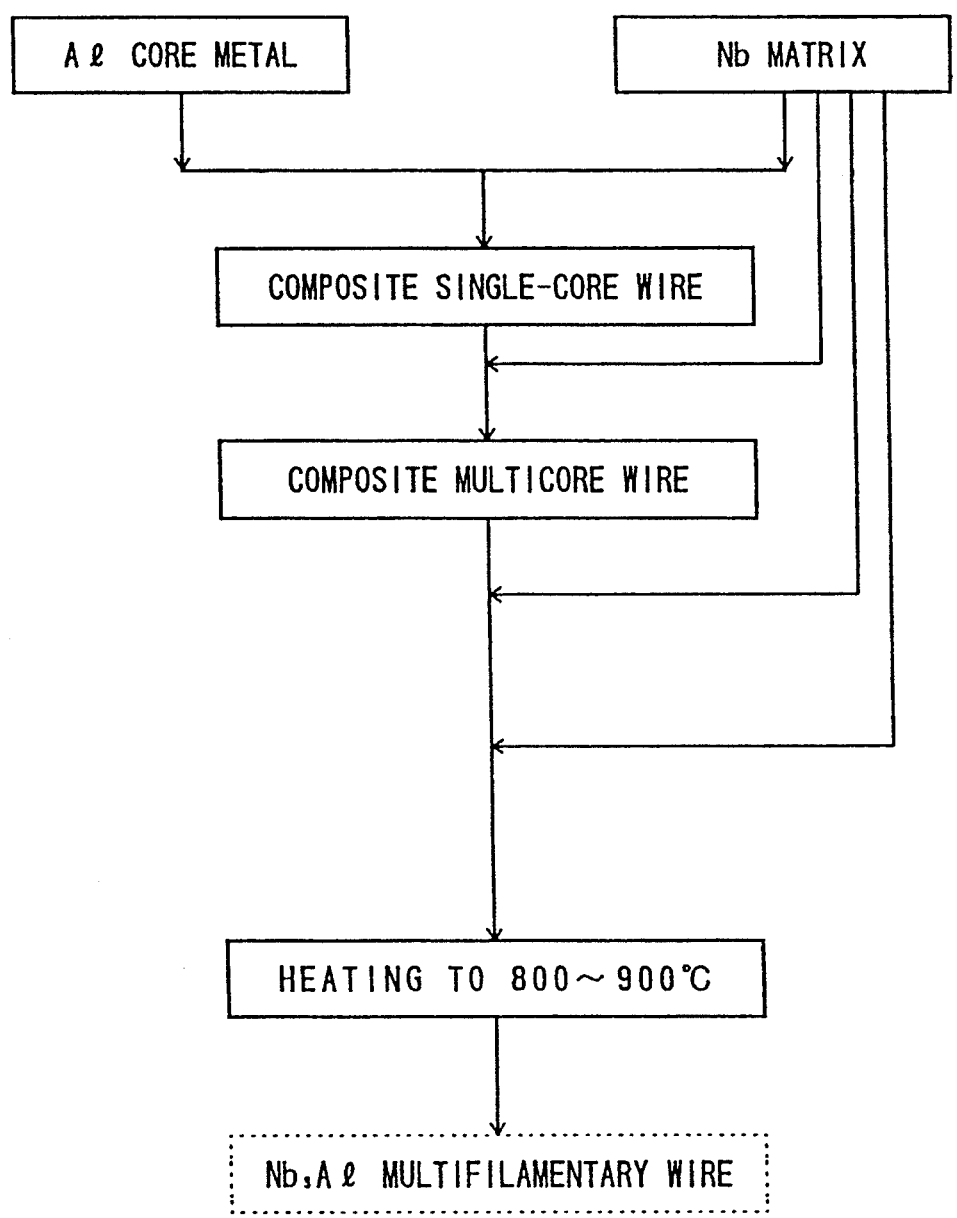
FIG. 2 is a block diagram showing steps of making a Nb$_3$Al multifilamentary wire according to the conventional method.

Referring now to the drawings, preferred embodiments of the present invention will be described, compared with conventional methods. FIG. 1 is a block diagram showing steps of making a Nb$_3$Al multifilamentary wire according to the present invention. FIG. 2 is a block diagram showing steps of making a Nb$_3$Al multifilamentary wire according to the conventional method. An Al core material is combined with Nb pipe to drawing the composite into a fine wire. The process for making the Nb$_3$Al multifilamentary wire comprises the steps of combining an Al core material with a Nb pipe, drawing the composite into a composite single-core fine wire, recombining a large number of the drawn composite single-core fine wires with a Nb pipe, and drawing the composite into a composite multicore fine wire. These steps are used both in the present invention and the conventional processes. In the conventional process, a large number of the composite multicore wires are further combined with a Nb pipe and drawing the composite into a composite multicore fine wire, and such steps are repealed until an Al alloy core wire having a diameter of 0.1 pm can be obtained. However, even if the diameter of the Al core wire is several $\mu$m, the present invention can provide a sufficient electromagnetic properly to the final product. This is because a phase of Nb$_3$Al stable at high temperatures can be brought to room temperature by producing a supersaturated solid solution of stoichiometric Nb$_3$Al or rich in Nb than that value and rapid-cooling the solid solution, Further, when the rapid cooled composite multi core wire is a solid solution richer in Nb than that of Nb$_3$Al, further drawing of the multicore wire to a fine wire, or assembling a number of the composite fine wires to integrate or strand them can be carried out. Finally, an electromagnetically stable Nb$_3$Al multifilamentary superconducting wire coated with an electromagnetically stabilizing metal and having a high current density at a high magnetic field can be obtained by heating the composite multicore wire of the final dimension to a temperature ranging from about 700° to 950° C. and carrying out rearrangement and fining of Nb$_3$Al crystals.

EXAMPLE 1

A composite single-core wire was fabricated by inserting an Al-5 at. % Mg alloy rod of 5.0 mm in diameter into a Nb pipe having the inside diameter of 7.0 mm and the outside diameter of 11.0 mm, and cold drawing the resulting composite into a wire having the outside diameter of 1.0 mm at room temperature. The composite single-core wire of 1.0 mm in diameter was then cut into short pieces and the bundled 331 short cut single-core wires were packed into a Nb pipe of 21.5 mm I.D. and 25.5 mm O.D. and was cold drawn into a wire having the O.D. of 0.22 mm at room temperature to provide a composite multicore wire. At this time, each of the cold drawn Al-5 at. % Mg core wires has a diameter of about 5 $\mu$m. Then, this composite multicore wire was dipped into a molten silver bath which was heated to a temperature of 1700° C. to melt the silver under an argon gas atmosphere of 1 atmospheric pressure for ten minutes for covering the composite multicore wire with the silver coating having a thickness of about 50 μm, and the composite multicore wire covered with silver was cooled to room temperature. Thereafter, it was heated under vacuum at 850° C. for 50 hrs. to obtained a Nb₃Al multifilamentary superconducting wire covered with the silver coating.

Figure 3:
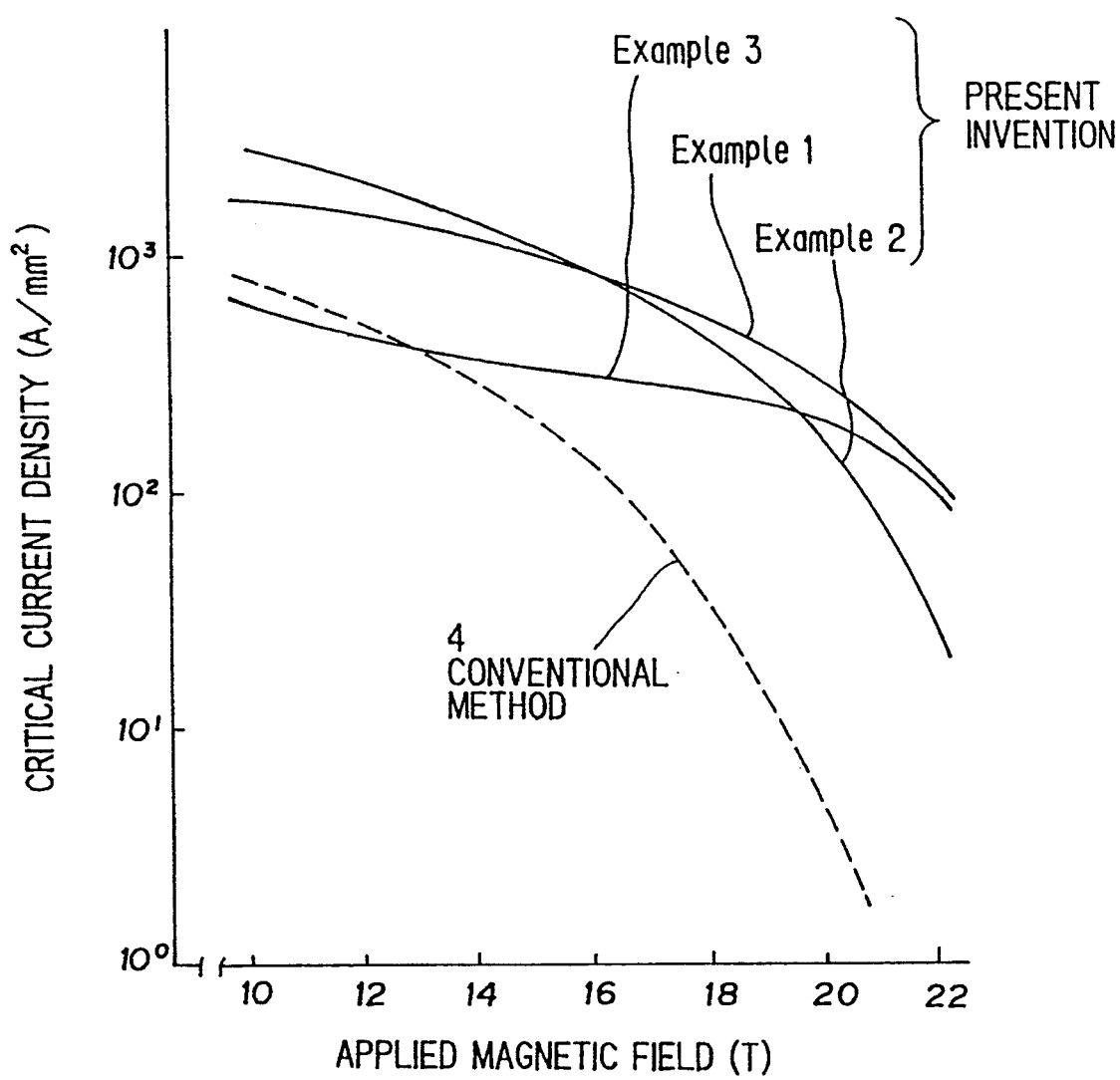
FIG. 3 shows magnetic field-critical current density curves for Nb$_3$Al multifilamentary wires made by present invention or conventional process at 4.2K.

Next, samples were cut from this Nb₃Al multifilamentary superconducting wire and their critical temperature $T_c$ and electric resistance of the matrix were measured at a temperature just above the critical temperature by changing temperatures using resistive method. These samples showed a $T_c$ of 17.9K at the midpoint and a matrix resistivity of $1.6 \times 10^{-8}$ ohm cm. Conventional Nb₃Al multifilamentary wire has a $T_c$ of 15.6K and a matrix resistivity of $5.0 \times 10^{-7}$ ohm cm and thus the present multifilamentary wire has 2.3K for $T_c$ and 1/30 for matrix resistivity superior to those of the conventional one, respectively. Their critical currents $I_c$ were also measured by changing the electric field at 4.2K and the results are shown in FIG. 3. The critical current $I_c$ is defined as the current at a point of generating an electric field of 1 μV/cm and the critical current density is defined as $I_c/S$, where S is the total cross-sectional area except that of a stabilizing material. FIG. 3 shows magnetic field as critical current density curves, and curve 1 is for the Nb₃Al multifilamentary wire made according to this example 1 and curve 4 is for that made by conventional composite forming process. It is obvious from FIG. 3 that the present method can provide a Nb₃Al multifilamentary wire having the critical current density higher than that of conventional method in the entire range of magnetic fields higher than 10 T and in particular, in the range greater than 15 T, for example, it has a critical current density of about 100 times that of the conventional one.

EXAMPLE 2

Similarly to Example 2, a composite single-core wire and a composite multicore wire were fabricated and finally a composite multicore wire consisting of 109,561 Al-5 at. % Mg cores each having a 1 μm in diameter and a Nb matrix and having the O.D. of 1 mm was produced. Then this composite multicore wire was dipped into a Cu-10 at. % Nb bath which was heated to 1400° C. to melt it under an argon gas atmosphere of 100 torr for ten minutes, to cover the composite multicore wire with the Cu—Nb alloy coating of 1 mm thickness, and then the covered wire was rapidly cooled to room temperature. Thereafter, the cooled wire was heated at 850° C. for 50 hrs, under vacuum atmosphere to obtain a copper-coated Nb₃Al ultrafine multicore superconducting wire.

The critical temperature and magnetic field-critical current density characteristics of the samples, and electric resistance of the matrix of the samples were measured in a similar manner as Example 1. The samples showed a critical temperature of 17.3K which is slightly lower than that of Example 1, and a matrix resistivity of $1.1 \times 10^{-8}$ ohm cm which is superior to that of Example 1. The magnetic field-critical current density curve of this sample is shown in FIG. 3. The critical current, density of this sample shown by curve 2 is remarkably improved, compared with that of the sample made by conventional method and shown by curve 4, but it is slightly lowered than that, of Example 1 in the range of magnetic field higher than 17 T. This cause seems that the sample of Example 2 was heat treated at such a lower temperature as 1400° C., compared with 1700° C. of Example 1. However, this Nb₃Al multifilamentary superconducting wire has a high current density which can withstand practical use at magnetic field lower than 20 T and has a stable electromagnetic properties.

EXAMPLE 3

In order to produce a composite multi core wire of Nb—Al supersaturated solid solution richer than Nb₃Al in Nb, a composite single-core wire having a cross-sectional ratio of an Al-5 at. % Mg core material to a Nb matrix different from that of Example 1 was prepared. That is, first a composite single-core wire was produced by inserting an Al-5 at. % big alloy rod having a 5.5 mm diameter into a Nb pipe having the inside diameter of 11.0 mm and the outside diameter of 6.0 mm, and cold drawing the composite into a wire having the outside diameter of 1.0 mm at room temperature.

Next, similarly to the process of Example 1, the bundled 331 composite single-core wires were packed into a Nb pipe and the composite was cold drawn into a composite multi core wire of a 0.2 mm diameter and comprising the multicore wires each having a 4 μm diameter. Then, this cold drawn composite multicore wire was dipped into a molten silver bath heated to 1700° C. for 10 minutes under an argon gas atmosphere of 1 atmospheric pressure for covering the composite multicore wire with a silver coating having about 50 μm thickness and the covered wire was rapidly cooled to room temperature. Finally, the silver coated composite multicore wire having the outside diameter of 0.3 mm was cold drawn into a wire having the outside diameter of 0.2 mm at room temperature. This cold drawing or plastic deformation could be carried out because the core material of the composite multicore wire became Nb—Al supersaturated solid solution instead of A-15 type intermetallic compound. Thereafter, the silver coated composite multicore wire was heated at 850° C. for 10 hrs. under vacuum for precipitating Nb₃Al intermetallic compound from the Nb—Al supersaturated solid solution to obtain a silver coated Nb₃Al multifilamentary superconducting wire.

Similarly to Examples 1 and 2, the critical temperature and magnetic field-critical current density characteristics of the samples, and the electric resistance of the matrix were measured and the results similar to Example 1 were obtained, for example, the critical temperature is 17.8K and the resistivity of the matrix is $1.6 \times 10^{-8}$ ohm cm. However, as shown in FIG. 3, the magnetic field-critical current density characteristics in this example are different from those of Examples 1 and 2, that is, they are lower than those of Examples 1 and 2, are higher than those of conventional process at high magnetic fields greater than 14 T, and the drop rate in the critical current density is less than those of Examples 1 and 2 even at a magnetic field in the vicinity of 20 T. Such differences in the magnetic field-critical current density characteristics are attributable to the amount of Nb₃Al compound, deviation from its stoichiometric composition, crystal grain size of Nb₃Al, etc. In any event, an electromagnetically stable Nb₃Al multifilamentary superconducting wire coated with an electromagnetically stabilizing metal and having a high current density enough to withstand the practical use at a high magnetic field could be obtained.

EXAMPLE 4

Figure 4:
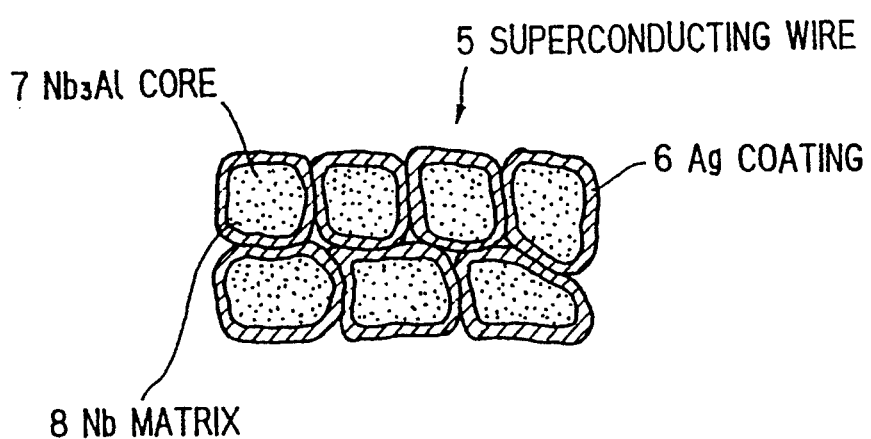
FIG. 4 is a schematic cross-sectional view of stranded seven Nb$_3$Al superconducting wires.

A composite multicore wire of which periphery is coated with a 50 p m thick Ag and which has a Nb—Al supersaturated solid solution was produced by a method similar to that of Example 3. At this time, the core material of the wire consisted of 109,561 wires and each of which had a diameter of 1 μm. Then, such seven wires were stranded and the stranded wires were passed through a flat-type rolls and a flat-type die to form a flat-type stranded wire having a 5.0 mm width×2.4 mm thick. Then, the stranded wire was healed at 850° C. for 10 hrs. under vacuum to precipitate a Nb$_3$Al intermetallic compound from the Nb—Al supersaturated solid solution, thereby producing a Nb$_3$Al multifilamentary superconducting wire. FIG. 4 shows a schematic cross-sectional structure of such a superconducting wire. The Nb$_3$Al multifilamentary superconducting wire 5 consists of seven wires and each of which consists of a large number of Nb$_3$Al core materials 7, a Nb matrix 8, and a silver coating 6 applied on the periphery of the wire 5.

Figure 5:
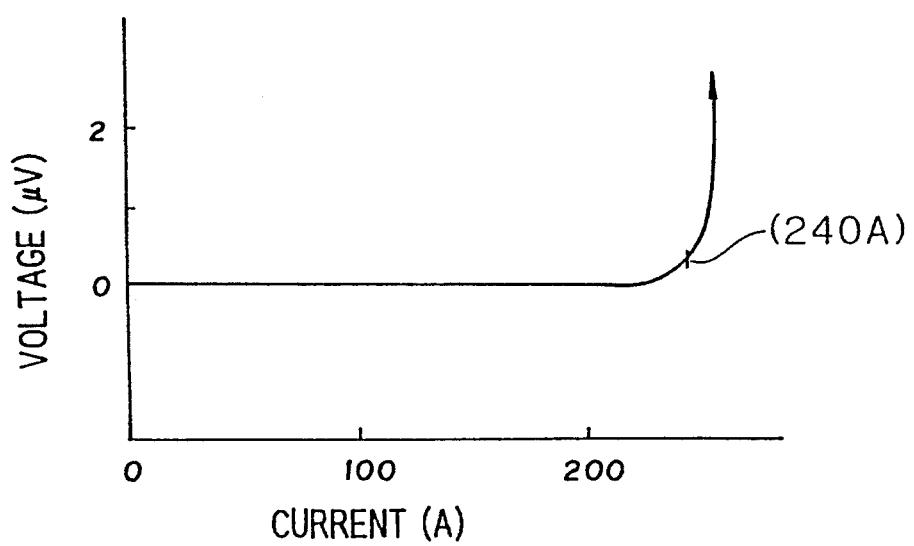
FIG. 5 is an current-voltage curve of Nb$_3$Al multifilamentary wire of the present invention.

Next, samples were prepared from this superconducting wire and the critical current characteristics at an outer magnetic field of 20 T in liquid He were measured. The result is shown in FIG. 5. Defining a current value at the generation of a resistance of $1.1 \times 10^{-11}$ ohm cm as a critical current value, it was 240 amperes. As shown in FIG. 5, the present Nb$_3$Al multifilamentary superconducting wire has an electromagnetical stability and large current capacity at the high magnetic field due to coating the wire with a stabilizing material, compared with the conventional wire.

EXAMPLE 5

Figure 6:
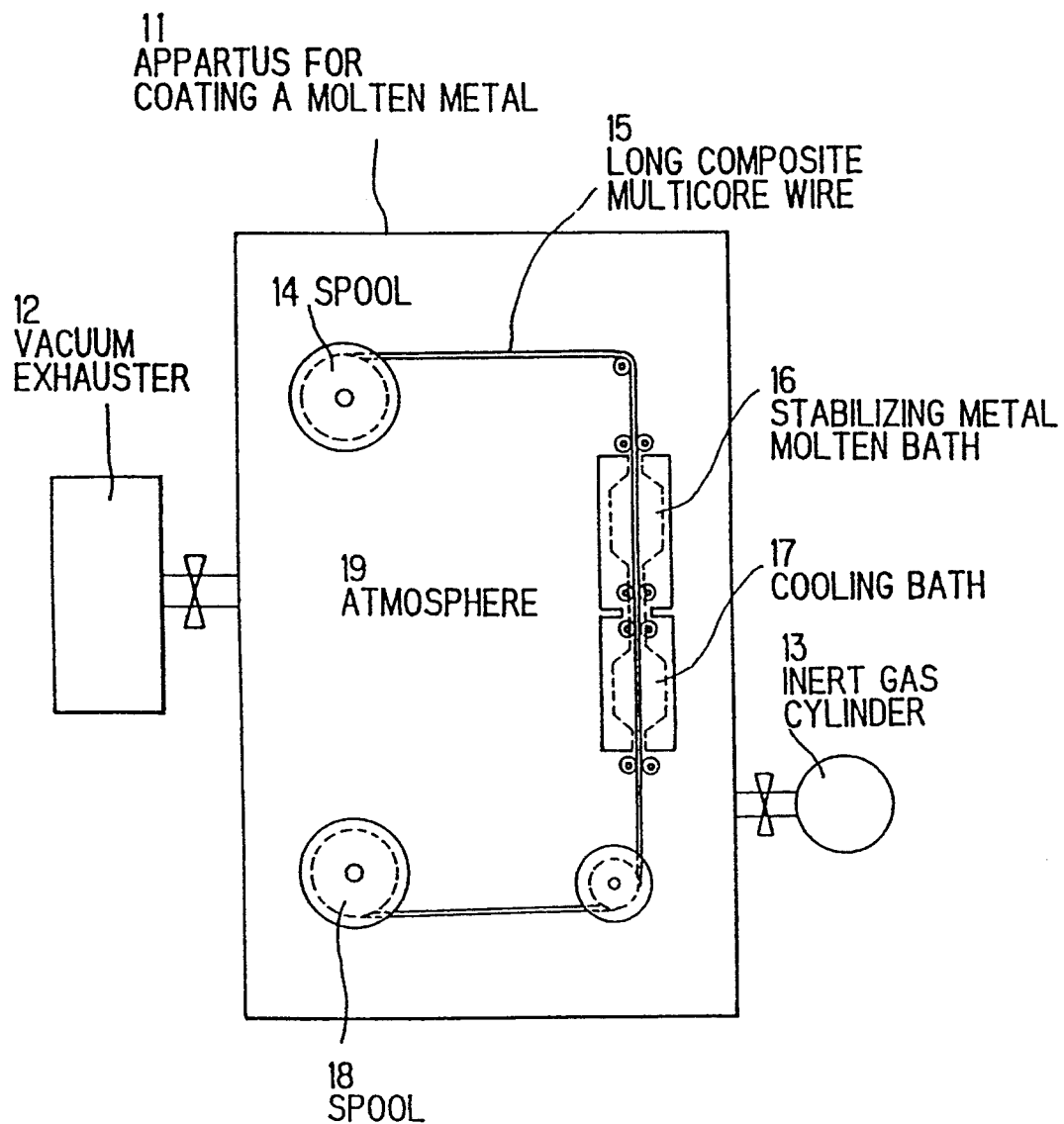
FIG. 6 is a schematic diagram of an apparatus for making Nb$_3$Al superconducting wires of the present invention.

FIG. 6 shows main components of an apparatus for making an Nb$_3$Al superconducting wire according to the present invention. A long composite multi core wire 15 consisting of a large number of Al alloy core wires and a Nb matrix and wound around a spool 14 is passed through a stabilizing metal molten bath 16 and a cooling bath 17, and is wound around a winding spool 18. A tool ten metal coating apparatus 11 has a vacuum exhauster 12 and an inert gas cylinder 13 to control the pressure in the atmosphere 19 for the molten metal. The temperature for heating the molten metal bath 16 is selected depending on the structural stability of a Nb$_3$Al compound and the wettability of the molten stabilizing metal with tire Nb$_3$Al compound and it requires at least 1200° C. or more temperature, and the pressure of the atmosphere 19 is selected depending on a kind of the stabilizing metal and a heating temperature and it requires an inert gas atmosphere of 0.1 or more atmospheric pressure. A Ga—In eutectic alloy bath or a variety of salt baths are used for the cooling bath 17 so as to rapidly cool the superconducting wire from 1200° C. or more temperature to a temperature ranging from 700° to 800° C.

INDUSTRIAL APPLICABILITY

As described above, the present invention can provide a Nb$_3$Al superconducting wire having an ultrafine multicore structure coated with an electromagnetically stabilizing material and a high current density at a high level of magnetic field such as 20 T and thus has the following effectiveness.

As this superconducting wire has a high current density at a high level of magnetic field such as 20 T which has been impossible to be realized by using only a superconducting magnet can be economically produced using a smaller type of apparatus. In addition, the present superconducting wire has a multifilamentary structure coated with an electromagnetically stabilizing material, so that a high level of magnetic field such as 20 T can be stably generated in a short time without transferring to the normal conduction, thereby enabling provide an economical apparatus with a reduced liquid helium consumption.

What is claimed is:

1. In a process for making a Nb$_3$Al superconductive wire, comprising the steps of preparing a composite consisting of a large number of Al or Al alloy core wires and Nb matrixes, cold drawing the composite into a composite multicore wire, and heat treating the composite multicore wire, the improvement comprising dipping said cold drawn composite multicore wire, simultaneously with said heat treating step, into a molten metal so as to solidify the molten metal around the composite multicore wire and thus form a stabilized metal layer on an outer periphery of the Nb$_3$Al superconductive wire.

2. The process for making a Nb$_3$Al superconductive wire according to claim 1, wherein each of said cold drawn Al or Al alloy core wires has a diameter or thickness of about 0.1 to about 10 μm.

3. The process for making a Nb$_3$Al superconducting wire according to claim 1, wherein during said dipping step, said composite multicore wire is heated to a temperature higher than 1200° C., and after said dipping step said composite multicore wire is instantly cooled and additionally heat-treated at a temperature ranging from 700° to about 950° C.

4. The process for making a Nb$_3$Al superconducting wire according to claim 1, wherein said dipping step of the composite multicore wire into the molten metal is carried out in the molten metal kept at a constant temperature under an inert gas atmosphere of 0.1 pressure or more.

5. The process for making a Nb$_3$Al superconducting wire according to claim 1, wherein a number of said composite multicore wires each having the stabilized metal formed at the periphery thereof, are integrated or stranded.

6. The process for making a Nb$_3$Al superconducting wire according to claim 1, further comprising the steps of providing a spool for winding off a composite multicore wire, a spool for winding up the wound off composite multicore wire and guide rolls for guiding the composite multicore wire in a closed chamber having an inert gas supply means and a vacuum exhauster, and providing a molten metal bath and a cooling bath arranged in series between said guide rolls.

7. A process for making a superconductive wire of Nb$_3$Al system, comprising the steps of cold-drawing and then heat-treating a composite multi-core wire including a large number of Al or Al-alloy core materials and Nb matrixes, solidifying a molten metal selected from the group consisting of copper, copper-alloy, silver and silver-alloy around said composite multi-core wire, simultaneously with said heat-treating of said composite multi--core wire, by dipping said composite multi-core wire into the molten metal so as to form a stabilized metal layer on an outer periphery of the superconductive wire.

8. A process for making a superconductive wire, comprising the steps of combining an Al or Al-alloy core material with a Nb matrix to provide a composite member, cold-drawing said composite member into a composite single-core wire, combining a plurality of composite single-core wires with a Nb matrix, cold-drawing the combined composite single-core wires and said Nb matrix into a composite multi-core wire, and solidifying molten metal selected from the group consisting of copper, copper-alloy, silver and silver-alloy around said composite multi-core wire simultaneously with heating said composite multi-core wire by dipping said composite multi-core wire into said molten metal to thereby produce a Nb$_3$Al superconductive wire with a stabilized metal layer on an outer periphery thereof.

* * * * *